(12) United States Patent
Kumagai

(10) Patent No.: US 9,407,190 B2
(45) Date of Patent: Aug. 2, 2016

(54) ELECTRIC POWER STEERING APPARATUS

(71) Applicant: NSK LTD., Tokyo (JP)

(72) Inventor: Shin Kumagai, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 14/429,420

(22) PCT Filed: Nov. 6, 2012

(86) PCT No.: PCT/JP2012/078691
§ 371 (c)(1),
(2) Date: Mar. 19, 2015

(87) PCT Pub. No.: WO2014/073032
PCT Pub. Date: May 15, 2014

(65) Prior Publication Data
US 2015/0244302 A1    Aug. 27, 2015

(51) Int. Cl.
*H02P 6/14* (2016.01)
*H02P 27/08* (2006.01)
*B62D 5/04* (2006.01)
*H02M 1/08* (2006.01)
*H02P 6/08* (2016.01)

(52) U.S. Cl.
CPC ............... *H02P 27/08* (2013.01); *B62D 5/046* (2013.01); *H02M 1/08* (2013.01); *H02P 6/085* (2013.01)

(58) Field of Classification Search
CPC .......... H02P 27/08; H02P 6/085; B62D 5/046
USPC ................................... 318/400.27
See application file for complete search history.

(56) References Cited

U.S. PATENT DOCUMENTS

| | | | | |
|---|---|---|---|---|
| 6,727,669 B2* | 4/2004 | Suzuki | ........... | B62D 5/0463 180/446 |
| 7,880,411 B2* | 2/2011 | Nagase | ........... | B62D 5/0457 180/2.1 |
| 8,018,191 B2* | 9/2011 | Nagase | ........... | B62D 5/046 318/433 |
| 8,521,368 B2* | 8/2013 | Shimizu | ........... | B62D 5/0481 180/443 |

FOREIGN PATENT DOCUMENTS

| | | |
|---|---|---|
| JP | 08-340694 A | 12/1996 |
| JP | 11-152049 A | 6/1999 |
| JP | 11-240459 A | 9/1999 |
| JP | 2002-037099 A | 2/2002 |
| JP | 2004-173336 A | 6/2004 |

(Continued)

OTHER PUBLICATIONS

International Search Report for PCT/JP2012/078691 dated Feb. 12, 2013.

*Primary Examiner* — Erick Glass
(74) *Attorney, Agent, or Firm* — Sughrue Mion, PLLC

(57) ABSTRACT

An electric power steering apparatus is provided in which stably performing drive of FETs of an inverter can be achieved by means of a simplified constitution. The electric power steering apparatus drive-controls a motor through an inverter comprised of an FET bridge based on each-phase duty command values of pulse-width modulation (PWM) and perform assist control of a steering system. The electric power steering apparatus comprises a charge pump circuit and a bootstrap circuit that generate a booster power voltage for driving upper-FETs of the FET bridge, wherein the circuit having a higher voltage is used as the booster power voltage.

5 Claims, 5 Drawing Sheets

(56) References Cited

FOREIGN PATENT DOCUMENTS

| JP | 2004-304527 A | 10/2004 |
| JP | 2005-051926 A | 2/2005 |
| JP | 2007-006207 A | 1/2007 |
| JP | 2007-202267 A | 8/2007 |
| JP | 2009-220766 A | 10/2009 |
| JP | 2011-156988 A | 8/2011 |
| JP | 2012-182884 A | 9/2012 |

* cited by examiner

ELECTRIC POWER STEERING APPARATUS

CROSS REFERENCE TO RELATED APPLICATIONS

This application is a National Stage of International Application No. PCT/JP2012/078691 filed Nov. 6, 2012, the contents of all of which are incorporated herein by reference in their entirety.

TECHNICAL FIELD

The present invention relates to an electric power steering apparatus that assist-controls a steering system of a vehicle by means of a motor controlled by an inverter drive based on PWM duty command values, and in particular to an electric power steering apparatus capable of stably performing the inverter drive by means of a simplified constitution and control.

BACKGROUND ART

An electric power steering apparatus that assist-controls a steering system of a vehicle by using a rotational torque of a motor, applies a driving force of the motor as a steering assist torque to a steering shaft or a rack shaft by means of a transmission mechanism such as gears or a belt through a reduction mechanism. And then, in order to supply a current to the motor so that the motor generates a desired torque, an inverter comprised of an FET bridge is used in a motor drive circuit.

A general configuration of a conventional electric power steering apparatus will be described with reference to FIG. 1. As shown in FIG. 1, a column shaft (a steering shaft) 2 connected to a steering wheel (handle) 1, is connected to steered wheels 8L and 8R through reduction gears 3, universal joints 4a and 4b, a rack and pinion mechanism 5, and tie rods 6a and 6b, further via hub units 7a and 7b. Further, the column shaft 2 is provided with a torque sensor 10 for detecting a steering torque of the steering wheel 1, and a motor 20 for assisting the steering force of the steering wheel 1 is connected to the column shaft 2 through the reduction gears 3. Electric power is supplied to a control unit (an ECU) 100 for controlling the electric power steering apparatus from a battery 13, and an ignition key signal is inputted into the control unit 100 through an ignition key 11. The control unit 100 calculates a current command value of an assist (steering assist) command based on a steering torque T detected by the torque sensor 10 and a velocity V detected by a velocity sensor 12, and controls a current I supplied to the motor 20 based on a voltage command value E obtained by performing compensation and so on with respect to the current command value in a current control section. Furthermore, it is also possible to receive the velocity V from a CAN (Controller Area Network) and so on.

The control unit 100 mainly comprises a CPU (or an MPU or an MCU), and general functions performed by programs within the CPU are shown in FIG. 2.

Functions and operations of the control unit 100 will be described with reference to FIG. 2. As shown in FIG. 2, the steering torque T detected by the torque sensor 10 and the velocity V detected by the velocity sensor 12 are inputted into a current command value calculating section 101. The current command value calculating section 101 decides a current command value Iref1 that is the desired value of the current I supplied to the motor 20 based on the steering torque T and the velocity V and by means of an assist map and so on. The current command value Iref1 is added in an addition section 102A and then the added value is inputted into a current limiting section 103 as a current command value Iref2. A current command value Iref3 that is limited the maximum current, is inputted into a subtraction section 102B, and a deviation Is (=Iref3−Im) between the current command value Iref3 and a motor current value Im that is fed back, is calculated. The deviation Is is inputted into a current control section 104 that performs PI control and so on. The voltage command value E that characteristic improvement is performed in the current control section 104, is inputted into a PWM control section 105. Furthermore, the motor 20 is PWM-driven through an inverter 106 serving as a drive section. The current value Im of the motor 20 is detected by a current detector 106A within the inverter 106 and is fed back to the subtraction section 102B. In general, the inverter 106 uses EFTs as switching elements and is comprised of a bridge circuit of FETs.

Further, a compensation signal CM from a compensation section 110 is added in the addition section 102A, and the compensation of the system is performed by the addition of the compensation signal CM so as to improve a convergence, an inertia characteristic and so on. The compensation section 110 adds a self-aligning torque (SAT) 113 and an inertia 112 in an addition section 114, further adds the result of addition performed in the addition section 114 and a convergence 111 in an addition section 115, and then outputs the result of addition performed in the addition section 115 as the compensation signal CM.

In the case that the motor 20 is a 3-phase (U-phase, V-phase and W-phase) brushless motor, details of the PWM control section 105 and the inverter 106 are a configuration such as shown in FIG. 3. The electric power is supplied to the PWM control section 105 and the inverter 106 from the battery 13 through a power switch 14. The PWM control section 105 comprises a duty calculating section 105A that calculates PWM duty command values D1~D6 of three phases according to a given expression based on the voltage command value E, an upper-FET gate driving section 105B1 that switches ON/OFF after driving each gate of upper-FET1~upper-FET3 by the PWM duty command values D1~D3, a lower-FET gate driving section 105B2 that switches ON/OFF after driving each gate of lower-FET4~lower-FET6 by the PWM duty command values D4~D6, and a booster power circuit 105C for boosting a power-supply voltage of the upper-FET gate driving section 105B1. The upper-FET gate driving section 105B1 and the lower-FET gate driving section 105B2 comprise a U-phase gate driving section, a V-phase gate driving section, and a W-phase gate driving section, respectively. Further, the inverter 106 comprises a three-phase bridge having top and bottom arms comprised of upper-FET1 and lower-FET4 of U-phase, top and bottom arms comprised of upper-FET2 and lower-FET5 of V-phase, and top and bottom arms comprised of upper-FET3 and lower-FET6 of W-phase, and drives the motor 20 by FET1~FET6 being switched ON/OFF based on the PWM duty command values D1~D6.

In such an electric power steering apparatus, as the booster power circuit (105C), for example, Japanese Published Unexamined Patent Application No.2004-173336 A (Patent Document 1) generates a booster power by using a charge pump circuit, and as another example, Japanese Published Unexamined Patent Application No.2005-51926 A (Patent Document 2) generates the booster power by using a bootstrap circuit.

THE LIST OF PRIOR ART DOCUMENTS

Patent Documents

Patent Document 1: Japanese Published Unexamined Patent Application No.2004-173336 A
Patent Document 2: Japanese Published Unexamined Patent Application No.2005-51926 A
Patent Document 3: Japanese Published Unexamined Patent Application No.2009-220766 A

SUMMARY OF THE INVENTION

Problems to be Solved by the Invention

However, as disclosed in Patent Document 1, in the case of using a voltage of the charge pump circuit as a power supply for driving upper-FETs, in the case of being not capable of generating the booster power due to single failure or trouble of the charge pump circuit, it becomes impossible to drive upper-FETs of all arms. In the case of failure (trouble) of the charge pump circuit within the electric power steering apparatus, since it becomes impossible to ON/OFF-control the inverter, there is a problem that the current does not flow in the motor and an assist control stop status occurs.

Further, the bootstrap circuit of Patent Document 2 is a constitution that bootstrap capacitors are charged by the voltage during lower-FETS become ON, and when lower-FETS become OFF and upper-FETS become ON, using charging voltages of the bootstrap capacitors to drive upper-FETs. For this reason, if not turn lower-FETs ON during a predetermined time, since time to turn upper-FETs on becomes long, there is a problem that the charging voltages of the bootstrap capacitors drop and it becomes impossible to drive upper-FETs. Concretely, in the case of PWM-driving the FETs with 20 KHz, it is preferred that the upper-FETs use equal to or less than 90% (the lower-FETs use equal to or more than 10%), (due to the resistance value of the driving section of the controller and the capacity of FET capacitors, it is advisable to limit to equal to or less than 90%), limitation of the duty command values occurs. That is to say, when limiting the duty command values, since a maximum voltage that is capable of being applied to the motor of the electric power steering apparatus, for example, becomes 90% from 100%, there is a problem that the maximum voltage decreases 10% and the output of the motor decreases.

In order to prevent a situation that in the case of being not capable of generating the booster power due to the single failure of the above-described charge pump circuit, it becomes impossible to drive the upper-FETs of all arms, for example, as disclosed in Japanese Published Unexamined Patent Application No.2009-220766 A (Patent Document 3), by duplicating the charge pump circuit and using the voltage of the one having a high voltage of two charge pump circuits as the booster power, even the single failure of one of two charge pump circuits occurs, ensuring the booster power and continuing the assist control are proposed.

However, in the apparatus described in Patent Document 3, since duplicating the charge pump circuit, there is a problem that cost increases occur and circuit scale becomes large. Further, in the electric power steering apparatus, since there is a high possibility that failures of the same mode occur, a problem that duplication of the charge pump circuit has few technical effects also exists.

The present invention has been developed in view of the above-described circumstances, and an object of the present invention is to provide an electric power steering apparatus capable of stably performing drive of FETs of an inverter by means of a simplified constitution and control.

Means for Solving the Problems

The present invention relates to an electric power steering apparatus that drive-controls a motor by an inverter comprised of an FET bridge based on each-phase duty command values of PWM and performs assist control of a steering system, the above-described object of the present invention is achieved by that comprising: a charge pump circuit and a bootstrap circuit that generate a booster power voltage for driving upper-FETs of said FET bridge, wherein a voltage of one having a high voltage of said charge pump circuit and said bootstrap circuit is used as said booster power voltage.

Further, the above-described object of the present invention is more effectively achieved by that wherein determining a failure of said charge pump circuit, when said failure is determined, using a voltage generated by said bootstrap circuit to drive said upper-FETs of said FET bridge, and continuing said assist control; or wherein determination of said failure of said charge pump circuit is performed based on a system voltage and an output voltage of said charge pump circuit; or wherein when said failure of said charge pump circuit is determined, limiting each-phase duty command values of said upper-FETs.

Effects of the Invention

An electric power steering apparatus according to the present invention is provided with a charge pump circuit and a bootstrap circuit as a booster power voltage of an upper-FET gate driving section and uses the one having a high voltage of the charge pump circuit and the bootstrap circuit as the booster power. And then, even in the case that it becomes impossible to generate a power-supply voltage of the upper-FET gate driving section due to failures or the like of either one circuit, it is possible to continuously supply a boosted voltage by another circuit. Therefore, it is possible to prevent a situation that it becomes impossible to drive the FETs due to the single failure, and it is possible to stably continue the assist control of the electric power steering apparatus.

Moreover, an electric power steering apparatus according to the present invention determines failures (including troubles) of the charge pump circuit, and when determining that the failure of the charge pump circuit occurs, limits a maximum value with respect to the duty command values. Therefore, it is possible to prevent occurrence of a defect that it is impossible to generate a voltage by the bootstrap due to the duty command value becoming large and it becomes impossible to drive the upper-FETs, and it is possible to prevent variations in assist.

BRIEF DESCRIPTION OF THE DRAWINGS

In the accompanying drawings.

MODE FOR CARRYING OUT THE INVENTION

The present invention is provided with both a charge pump circuit and a bootstrap circuit as a booster power circuit and uses a voltage of either one having a high voltage of the charge pump circuit and the bootstrap circuit as a booster power. And then, even in the case that single failure (including a trouble) of either one of the charge pump circuit and the bootstrap circuit occurs, according to the present invention, it is possible to generate the booster power by another circuit to continuously supply. Therefore, even in the case that the single failure of either one of the charge pump circuit and the bootstrap circuit occurs, it is possible to stably continue the assist control. Further, since the charge pump circuit comprises a switching circuit, capacitors and diodes, therefore circuit scale of the charge pump circuit becomes large with respect to the simplified bootstrap circuit comprised of capacitors and diodes, as a result, the present invention has a merit that it is possible to reduce the circuit scale than the duplication of the charge pump circuit.

Hereinafter, embodiments of the present invention will be described in detail with reference to the accompanying drawings.

Figure 1:
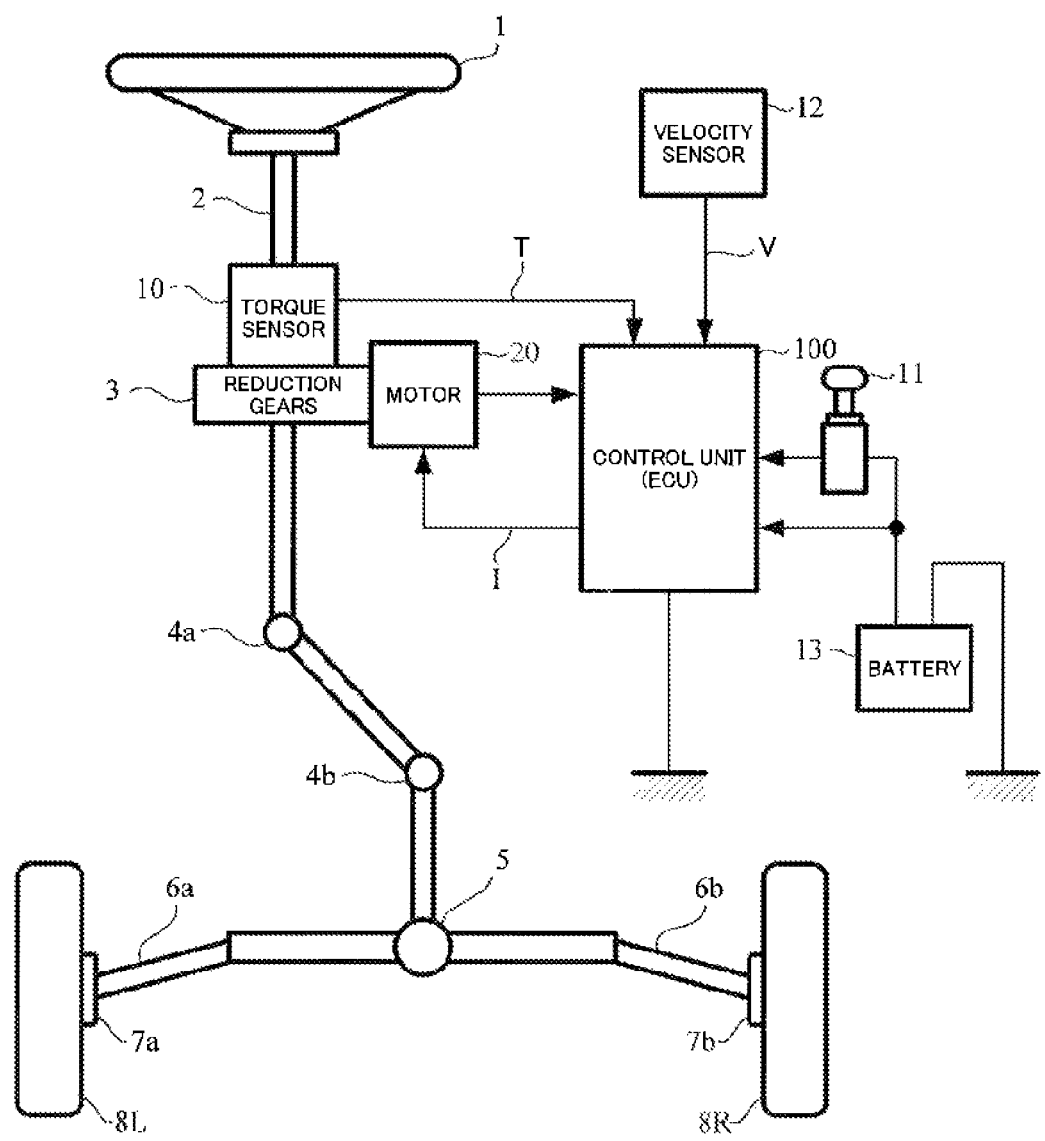
FIG. 1 is a diagram showing a configuration example of a general electric power steering apparatus.
Figure 2:
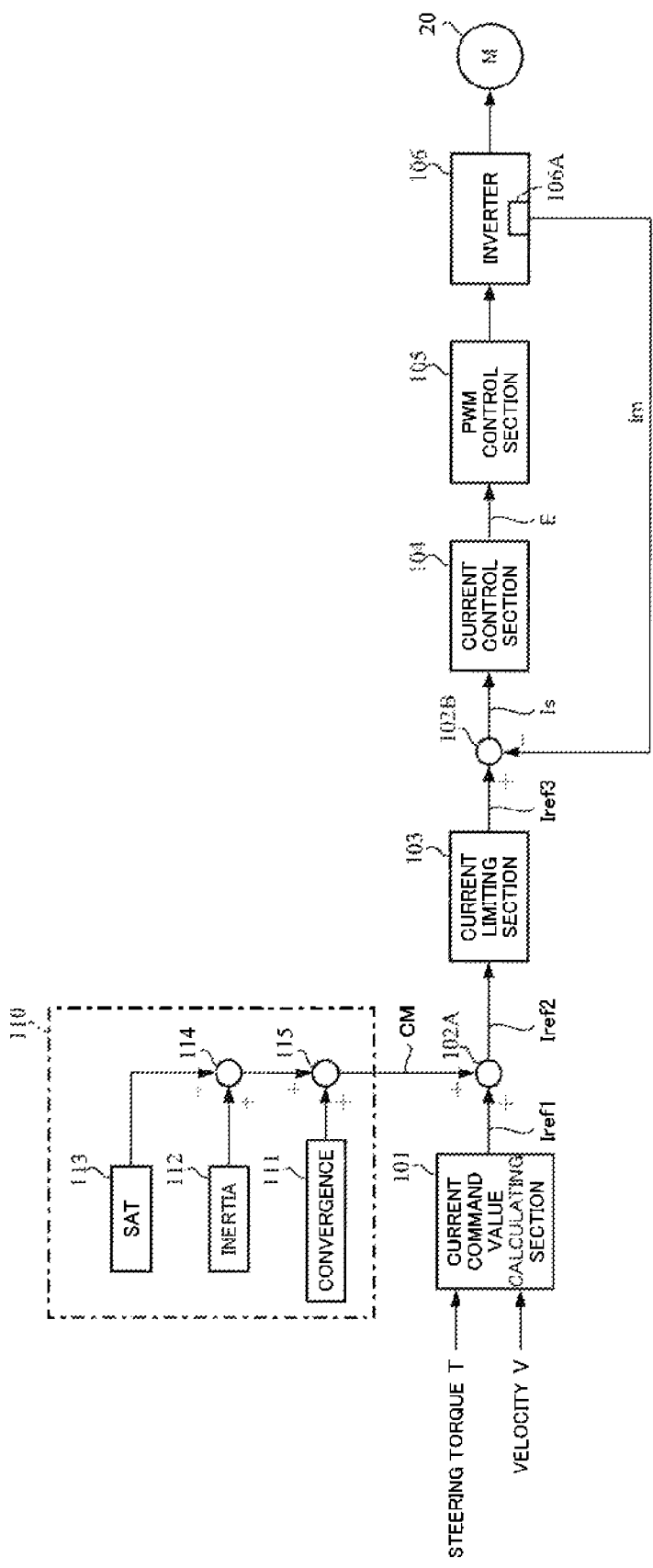
FIG. 2 is a block diagram showing one example of a control unit.
Figure 3:
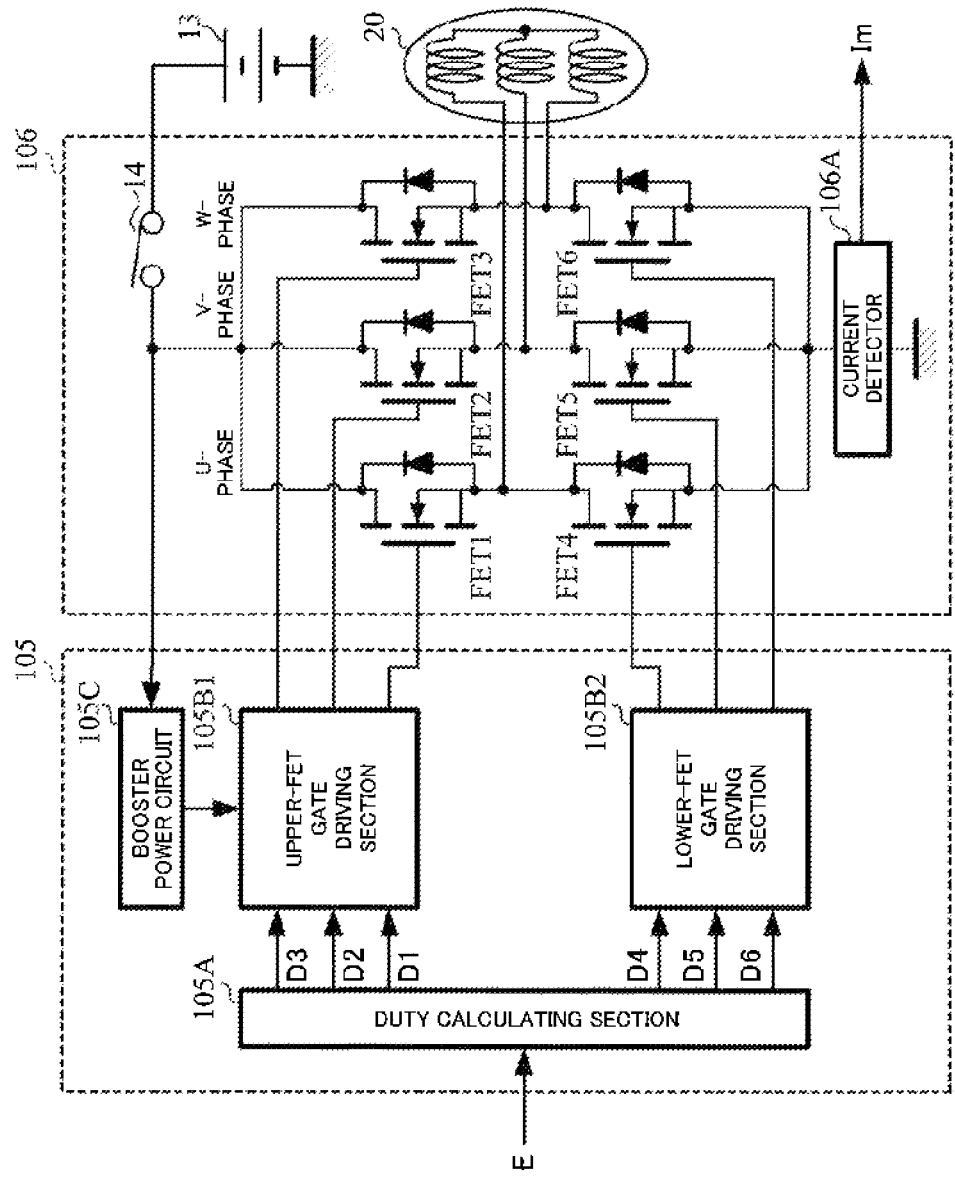
FIG. 3 is a wiring diagram showing a configuration example of a PWM control section and an inverter.
Figure 4:
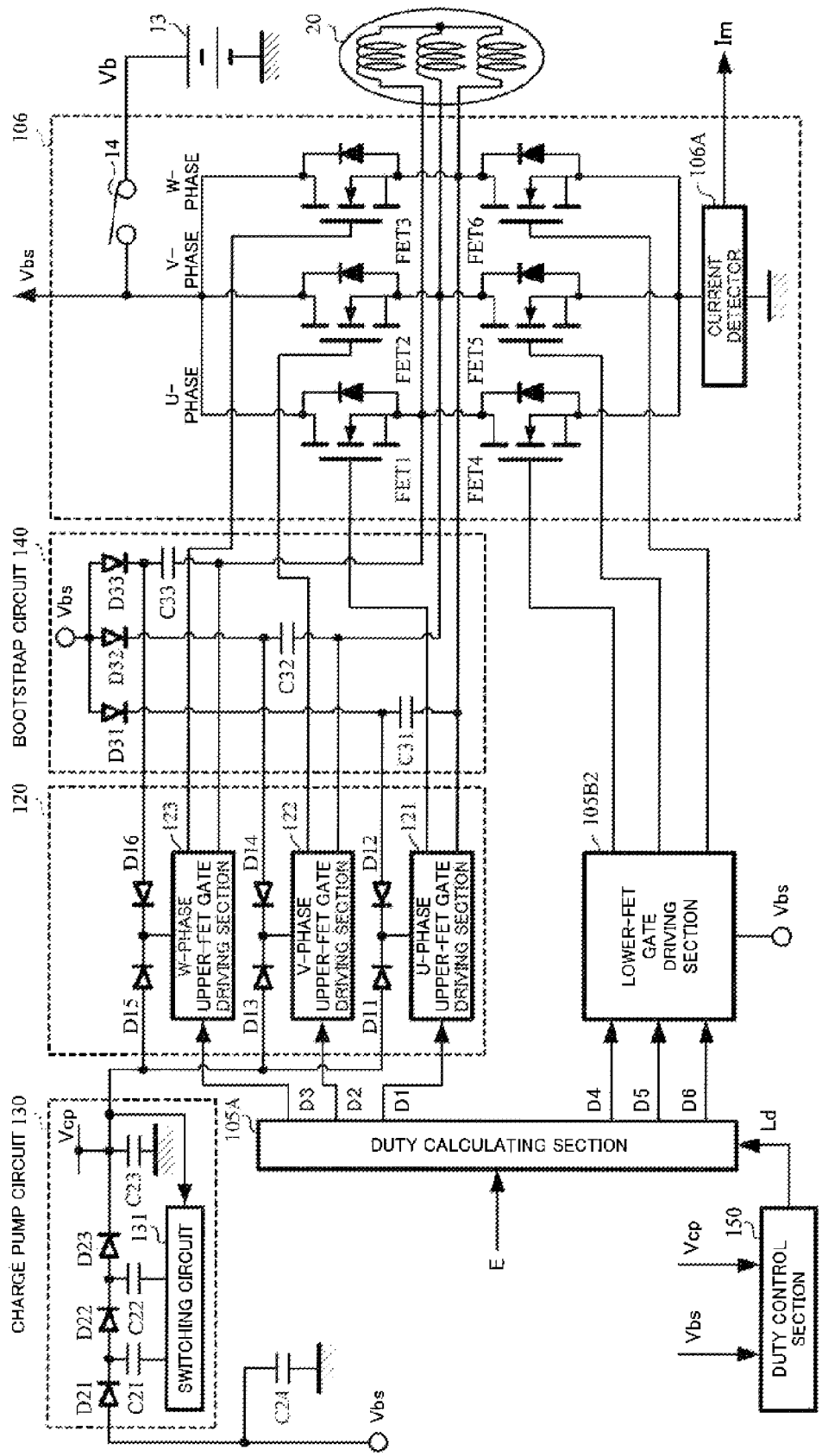
FIG. 4 is a wiring diagram showing a configuration example of the present invention.

A configuration example of the present invention is shown in FIG. 4 corresponding to FIG. 2. As shown in FIG. 4, the present invention is provided with a charge pump circuit 130 and a bootstrap circuit 140 as a booster power circuit of an upper-FET gate driving section 120, and is simultaneously provided with a duty control section 150 for setting a limit of a maximum value to duty command values D1~D3 that are calculated in a duty calculating section 105A.

The upper-FET gate driving section 120 comprises a U-phase upper-FET gate driving section 121, a V-phase upper-FET gate driving section 122 and a W-phase upper-FET gate driving section 123. In a booster power voltage section of the U-phase upper-FET gate driving section 121, a diode D11 is connected to a diode D12 in the reverse direction. In a booster power voltage section of the V-phase upper-FET gate driving section 122, a diode D13 is connected to a diode D14 in the reverse direction. In a booster power voltage section of the W-phase upper-FET gate driving section 123, a diode D15 is connected to a diode D16 in the reverse direction. Therefore, a voltage from one having a high boosted voltage of the diode D11 and the diode D12 is applied to the U-phase upper-FET gate driving section 121, a voltage from one having a high boosted voltage of the diode D13 and the diode D14 is applied to the V-phase upper-FET gate driving section 122, and a voltage from one having a high boosted voltage of the diode D15 and the diode D16 is applied to the W-phase upper-FET gate driving section 123.

Further, the charge pump circuit 130 comprises a switching circuit 131, a series circuit comprised of diodes D21~D23, and capacitors C21~C24 that are connected in parallel to the switching circuit 131 and the series circuit comprised of the diodes D21~D23. A system voltage Vbs that is supplied from a battery (a voltage Vb) is applied to the charge pump circuit 130, and an output voltage Vcp is applied to the diodes D11, D13 and D15 within the upper-FET gate driving section 120 and is simultaneously inputted into the switching circuit 131 for voltage monitoring.

The bootstrap circuit 140 is comprised of a series connection of a diode D31 and a capacitor C31 that is connected between the system voltage Vbs and a top/bottom connection point of U-phase of an inverter 106, a series connection of a diode D32 and a capacitor C32 that is connected between the system voltage Vbs and a top/bottom connection point of V-phase of the inverter 106, and a series connection of a diode D33 and a capacitor C33 that is connected between the system voltage Vbs and a top/bottom connection point of W-phase of the inverter 106 for every phase. And then, charging voltages of the capacitors C31~C33 are applied to the diodes D12, D14 and D16 within the upper-FET gate driving section 120, respectively.

The charge pump circuit 130 generates a boosted voltage (Vcp) regardless of drive of FET1~FET6 of the inverter 106 by charging the parallel-connected capacitors C21~C23 with the system voltage Vbs generated from the battery 13 via the switching circuit 131 and discharging the parallel-connected capacitors C21~C23. The charge pump circuit 130 of this embodiment is a constitution capable of boosting the battery voltage Vb to about 3 times, and voltage generation of the output voltage "Vcp=3×(Vbs−Vf)" is possible. Moreover, "Vf" is a voltage drop component of the diodes D21~D23. In general, in the case of driving the FETs, in order to certainly turn the FETs ON, it is preferred that a gate-to-source voltage is equal to or more than 10V. Therefore, the switching circuit 130 monitors the output voltage Vcp, and performs switching operation of the switching circuit 131 so that the output voltage Vcp becomes "Vbs+12V". That is to say, in the case of equal to or more than "Vb+12V", stopping the switching operation, and in the case of being smaller than "Vb+12V", performing the switching operation and operating so that the output voltage Vcp becomes "Vbs+12V".

On the other hand, with respect to the bootstrap circuit 140, in the case of taking U-phase as an example, when the lower-FET6 of the inverter 106 is in ON-state, the capacitor C31 is charged with the system voltage Vbs via the diode D31. That is to say, the capacitor C31 is charged with a small voltage that is just the voltage drop component Vf of the diode D31 with respect to source voltages of the upper-FET1~the upper-FET3. And then, in the case that the lower-FET6 is in OFF-state and the upper-FET3 is in ON-state, the charging voltage of the capacitors C31 becomes the source voltage, i.e. the system voltage Vbs.

As described above, either one having a high value of the output voltage Vcp generated by the charge pump circuit 130 and an output voltage (=2Vbs−Vr) generated by the bootstrap circuit 140, is stably supplied to the booster power of the U-phase upper-FET gate driving section 121 depending on conduction and shutoff functions of the diodes D11 and D12. "Vf" is the voltage drop component of the diode. It is completely similar with respect to other V-phase and W-phase.

In this way, in the present invention, the voltage of one having a high voltage of the charge pump circuit 130 and the bootstrap circuit 140 is used as the booster power voltage, and simultaneously, even in the case that it becomes impossible for either one booster power circuit to generate the booster power voltage of the upper-FET gate driving sections 121, 122 and 123, since it is possible to supply the boosted power voltage by the other circuit, it is possible to prevent a situation that it becomes impossible to drive the FETs due to the single failure, and it is possible to stably continue the assist control of the electric power steering apparatus.

In the case of using the bootstrap circuit 140, if not turn the lower-FET4~the lower-FET6 ON during a predetermined time, since a time to turn the upper-FET1~the upper-FET3 ON becomes long, the charging voltages of the bootstrap capacitors drop, it becomes impossible to drive the upper-FET1~the upper-FET3, and it becomes impossible to apply the current by the motor 20. Therefore, since there is a possibility that the current varies and variations in assist occur, it is necessary to limit the duty command values D1~D3. However, since the charge pump circuit 130 can generate the boosted voltage (Vcp) regardless of ON/OFF operations of the FET1~FET6, it is not necessary to limit the duty command values D1~D3.

In order to limit the maximum value of the duty command values D1~D3, the present invention is provided with the duty control section 150. That is to say, the duty control section 150 inputs the system voltage Vbs and the output voltage Vcp of the charge pump circuit 130, and monitors whether the charge pump circuit 130 is normal or not. In the case of determining that the failure (including the trouble) of the charge pump circuit 130 occurs, the duty control section 150 inputs a duty limit command Ld into the duty calculating section 105A, and then, the duty calculating section 105A limits (for example up to 90%) the maximum value of the duty command values D1~D3.

Figure 5:
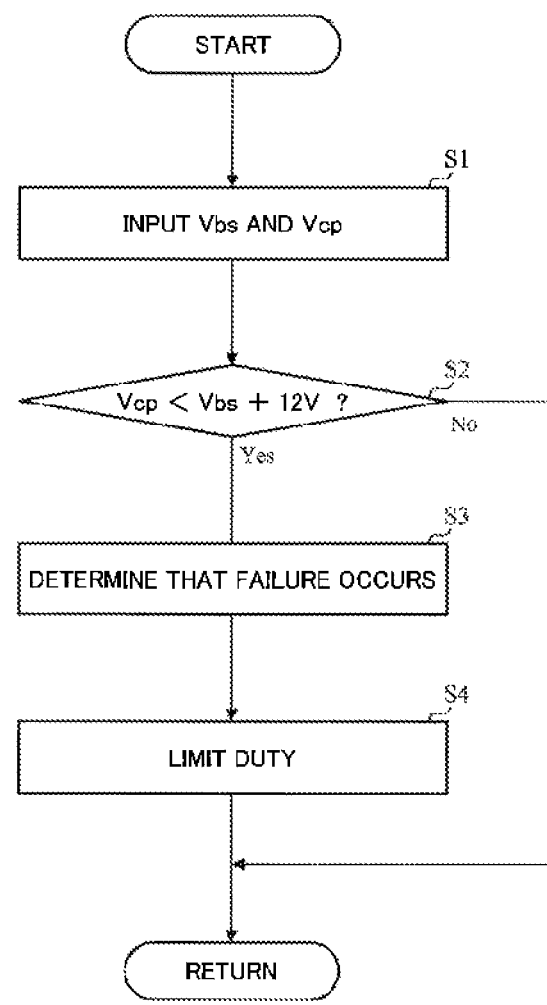
FIG. 5 is a flow chart showing an operation example of a duty control section.

FIG. 5 shows an operation example of the duty control section 150. As shown in FIG. 5, at first, the duty control section 150 inputs the system voltage Vbs and the output voltage Vcp of the charge pump circuit 130 (Step S1), and determines whether the output voltage Vcp is smaller than "Vbs+12V" or not (Step S2). In the case that the output voltage Vcp is smaller than "Vbs+12V", since it is impossible to normally drive the FETs, the duty control section 150 determines that the failure of the charge pump circuit 130 occurs (Step S3). In the case that the charge pump circuit 130 is normal, the limitation of the duty command values does not occur. However, in the case that the failure of the charge pump circuit 130 occurs, as described above, since it is necessary to limit the duty command values, in the case of determining that the failure of the charge pump circuit 130 occurs, the duty control section 150 inputs the duty limit command Ld into the duty calculating section 105A, and limits (for example up to 90%) the maximum value of the duty command values D1~D3 (Step S4).

In this way, by determining the failure of the charge pump circuit 130 and limiting the duty command values when the failure of the charge pump circuit 130 occurs, since it is possible to prevent a situation that it is impossible to generate the voltage by the bootstrap due to the duty command value becoming large and it becomes impossible to drive the upper-FETs, it is possible to prevent the variations in assist.

Moreover, although in the above-described embodiments, a three-phase motor is described, in the same way, it is possible to apply the present invention to a motor having a different number of phases such as a two-phase motor. Further, although in the above-described embodiments, an electric power steering apparatus provided with a compensation section, the compensation section is not necessarily required.

EXPLANATION OF REFERENCE NUMERALS 1 handle (steering wheel)
2 column shaft (steering shaft)
10 torque sensor
12 velocity sensor
20 motor
100 control unit
101 current command value calculating section
103 current limiting section
104 current control section
105 PWM control section
105A duty calculating section
106 inverter
106A current detector
110 compensation section
120 upper-FET gate driving section
130 charge pump circuit
140 bootstrap circuit
150 duty control section

The invention claimed is:

1. An electric power steering apparatus that calculates each-phase duty command values of PWM, based on said each-phase duty command values, drives upper-FETs of an FET bridge through an upper-FET gate driving section and drives lower-FETs of said FET bridge through a lower-FET gate driving section, and performs an assist control of a steering system by drive-controlling a motor with an inverter comprised of said FET bridge, comprising:
   a charge pump circuit and a bootstrap circuit that are connected to said upper-FET gate driving section and are connected with each other through diodes,
   a voltage from one having a high voltage of said charge pump circuit and said bootstrap circuit is used as a booster power voltage to drive said upper-FETs,
   in response to a failure of said charge pump circuit is determined, said upper-FETs of said FET bridge is driven by using a voltage generated at said bootstrap circuit and said assist control is continued, and
   wherein said upper-FET gate driving section is configured to control said upper-FETs and said lower-FET gate driving section is configured to control said lower-FETs.

2. An electric power steering apparatus according to claim 1, wherein determination of said failure of said charge pump circuit is performed based on a system voltage and an output voltage of said charge pump circuit.

3. An electric power steering apparatus according to claim 2, wherein when said failure of said charge pump circuit is determined, each-phase duty command values of said upper-FETs are limited.

4. An electric power steering apparatus according to claim 1, wherein
   said charge pump circuit is connected to a first diode and said bootstrap circuit is connected to a second diode, and
   said first diode and said second diode are connected with each other and are further connected to said upper-FET gate driving section.

5. An electric power steering apparatus according to claim 4, wherein
   said first diode and said second diode are connected with each other in a reverse direction.

* * * * *